US010396003B2

(12) United States Patent
Yoo et al.

(10) Patent No.: US 10,396,003 B2
(45) Date of Patent: Aug. 27, 2019

(54) STRESS TUNED STIFFENERS FOR MICRO ELECTRONICS PACKAGE WARPAGE CONTROL

(71) Applicant: Micron Technology, Inc., Boise, ID (US)

(72) Inventors: Chan H. Yoo, Boise, ID (US); Mark E. Tuttle, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/787,321

(22) Filed: Oct. 18, 2017

(65) Prior Publication Data

US 2019/0115270 A1   Apr. 18, 2019

(51) Int. Cl.
| | |
|---|---|
| *H01L 23/31* | (2006.01) |
| *H01L 21/66* | (2006.01) |
| *H01L 23/18* | (2006.01) |
| *H01L 23/373* | (2006.01) |
| *H01L 23/16* | (2006.01) |
| *H01L 23/00* | (2006.01) |

(52) U.S. Cl.
CPC .............. *H01L 23/18* (2013.01); *H01L 22/20* (2013.01); *H01L 23/16* (2013.01); *H01L 23/3135* (2013.01); *H01L 23/373* (2013.01); *H01L 23/562* (2013.01); *H01L 22/12* (2013.01); *H01L 23/3128* (2013.01)

(58) Field of Classification Search
CPC . H01L 23/18; H01L 23/3128; H01L 23/3135; H01L 23/373; H01L 22/20
See application file for complete search history.

(56) References Cited

U.S. PATENT DOCUMENTS

| | | | | |
|---|---|---|---|---|
| 5,576,630 A | * | 11/1996 | Fujita | G01R 31/2886 324/754.07 |
| 2003/0053297 A1 | | 3/2003 | Gaynes et al. | |

(Continued)

OTHER PUBLICATIONS

International Searching Authority—Korea; International Search Report and Written Opinion; PCT Application No. PCT/US2018/051544; dated Jan. 17, 2019.

*Primary Examiner* — Allen L Parker
*Assistant Examiner* — Gustavo G Ramallo
(74) *Attorney, Agent, or Firm* — Parsons Behle & Latimer

(57) ABSTRACT

A semiconductor device assembly including a substrate, a semiconductor device, a stiffener member, and mold compound. The stiffener member is tuned, or configured, to reduce and/or control the shape of warpage of the semiconductor device assembly at an elevated temperature. The stiffener member may be placed on the substrate, on the semiconductor device, and/or on the mold compound. A plurality of stiffener members may be used. The stiffener members may be positioned in a predetermined pattern on a component of the semiconductor device assembly. A stiffener member may be used so that the warpage of a first semiconductor device substantially corresponds to the warpage of a second semiconductor device at an elevated temperature. The stiffener member may be tuned by providing the member with a desired coefficient of thermal expansion (CTE). The desired CTE may be based on the individual CTEs of the components of a semiconductor device assembly.

6 Claims, 6 Drawing Sheets

(56) References Cited

U.S. PATENT DOCUMENTS

| | | | |
|---|---|---|---|
| 2004/0038447 A1* | 2/2004 | Corisis | H01L 23/3128 |
| | | | 438/106 |
| 2004/0173891 A1* | 9/2004 | Imai | H01L 23/49827 |
| | | | 257/686 |
| 2004/0188817 A1* | 9/2004 | Hua | H01L 23/36 |
| | | | 257/684 |
| 2009/0045512 A1* | 2/2009 | Hedler | H01L 21/486 |
| | | | 257/738 |
| 2009/0302485 A1 | 12/2009 | Fan | |
| 2010/0078786 A1* | 4/2010 | Maeda | H01L 23/16 |
| | | | 257/678 |
| 2014/0061891 A1 | 3/2014 | Kim et al. | |
| 2014/0146498 A1 | 5/2014 | Lee et al. | |
| 2017/0243858 A1* | 8/2017 | Chou | H01L 25/0657 |
| 2018/0247916 A1* | 8/2018 | Lee | H01L 25/0657 |

\* cited by examiner

STRESS TUNED STIFFENERS FOR MICRO ELECTRONICS PACKAGE WARPAGE CONTROL

FIELD

The embodiments described herein relate to stiffener members for warpage control of semiconductor device assemblies and/or semiconductor devices and methods using stiffener members for warpage control.

BACKGROUND

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. For example, the space available for memory devices, processors, and other devices continues to decrease in electronic products providing a need to increase the density of semiconductor devices. The stacking of semiconductor devices to form a semiconductor device assembly is one technique used to increase the density. Additionally, the thickness of semiconductor devices is continually being decreased.

During the process of forming a semiconductor device assembly, the assembly may go through various processes having an elevated temperature. For example, the temperature during a reflow process to create solder joints, or interconnections, between semiconductor devices may reach 260 degrees Celsius. A semiconductor devices assembly may be comprised of various components such as, but not limited to, a substrate, semiconductor devices, and mold compound. Each of the components may have different coefficients of thermal expansion (CTE). The use of thinner and thinner components may increase the potential problems created by CTE mismatch of the components within a semiconductor device assembly. As the semiconductor device assembly is subjected to an elevated temperature, the semiconductor device assembly may experience warpage due to the different CTEs of the individual components of the assembly. Warpage may provide a large amount of stress on the components of the assembly. If the warpage is too large, the warpage may create reliability issues with the solder joints within the semiconductor device assembly. For example, a warpage larger than, but not limited to, 50 microns may result in solder joint reliability issues.

CTE mismatch may also create problems in connecting a first semiconductor device to a second semiconductor device. The first semiconductor device may have a first warpage at an expected reflow temperature and the second semiconductor device may have a second warpage that differs from the first warpage at the expected reflow temperature. The differences between the first and second warpage may make it very difficult to connect the first semiconductor device to the second semiconductor device.

Additional drawbacks and disadvantages may exist.

Figure 1:
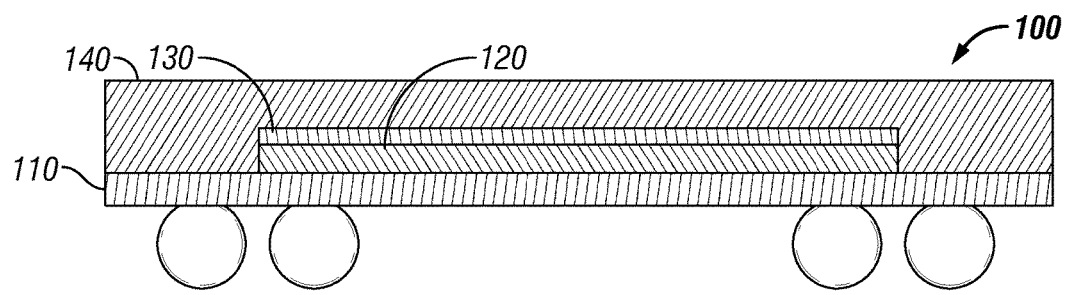
FIG. 1 is a schematic of one embodiment of a semiconductor device assembly having a stiffener member.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," and "lower" can refer to relative directions or positions of features in the semiconductor devices shown in the Figures.

For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, and methods of making and/or operating semiconductor devices. In one embodiment of the disclosure a stiffener member is positioned on a first or top side of a semiconductor device with the semiconductor device being positioned on a first or top side of a substrate. Mold compound encapsulates at least the semiconductor device and the stiffener member. The stiffener member is added to the semiconductor device assembly to control, in some aspect, the warpage of the semiconductor device assembly and/or the warpage of a component of the semiconductor device assembly. The stiffener member may be configured to be stressed to counteract the stress placed on the other components of the semiconductor device assembly due to warpage at an elevated temperature.

In one embodiment of the disclosure a stiffener member is positioned on top of a mold compound of a semiconductor device assembly, the mold compound encapsulating a semiconductor device position on a first or top side of a substrate. The stiffener member is added to the semiconductor device assembly to control, in some aspect, the warpage of the semiconductor device assembly and/or the warpage of a component of the semiconductor device assembly.

In one embodiment of the disclosure, a first warpage of a first semiconductor device assembly is determined. A stiffener member may then be "tuned" based on the first warpage. As used herein, the term "tuned" means that a stiffener member is configured to provide control, in some aspect, of the warpage of the semiconductor device assembly and/or the warpage of a component of the semiconductor device assembly. The stiffener member may be able to control, in some aspect, the warpage in various ways. For example, the CTE of the stiffener member, the location of the stiffener member, the number of stiffener members, and/or the shape of the stiffener member may reduce and/or control some aspect of the warpage of the semiconductor device assembly and/or semiconductor device. The stiffener member may be "tuned" by various aspects as would be appreciated by one of ordinary skill in the art having the benefit of this disclosure. For example, the stiffener member may be configured to provide a specific result to the warpage of a semiconductor device assembly and/or a semiconductor device by, but not limited to, varying the material of the stiffener member, varying the density of the stiffener member, varying the shape of the stiffener member, and/or varying the location of the stiffener member.

FIG. 1 is a schematic that shows one embodiment of the present disclosure of a semiconductor device assembly 100. The semiconductor device assembly 100 includes a semiconductor device 120 positioned on a first or top surface of a substrate 110. A stiffener member 130 is positioned on a first or top surface of the semiconductor device 120 and a mold compound 140 encapsulates at least the stiffener member 130 and the semiconductor device 120. The CTE of the substrate 110, the semiconductor device 120, and the mold compound 140 may differ, which may lead to unwanted warpage of the semiconductor device assembly 100 as the semiconductor device assembly 100 is subjected to elevated temperatures. For example, the semiconductor device assembly 100 may be subjected to temperatures of 260 degrees Celsius or possibly higher during various processing operations.

The stiffener member 130 may be tuned, or configured, to reduce and/or control the warpage of the semiconductor device assembly 100. The stiffener member 130 may also be configured to be stressed at an elevated temperature to counter the stress exerted upon the components (e.g., a substrate, semiconductor devices, mold compound) of a semiconductor device assembly due to warpage. The stiffener member 130 may have a CTE that differs from the individual CTEs of the substrate 110, the semiconductor device 120, and the mold compound 140. The stiffener member 130 may be configured with a specific CTE so that when located on the top surface of the semiconductor device 120 the warpage of the semiconductor device assembly 100 is reduced and/or controlled in some aspect. For example, the addition of the stiffener member 130 may reduce the warpage of the semiconductor device assembly 100 to be 50 microns or less when subjected to a specified elevated temperature, which may be acceptable. Additionally, the stiffener member 130 may be added to control the shape of the warpage of the semiconductor device assembly 100 as discussed herein. The size, shape, and/or the location of the stiffener member 130 are shown for illustrative purposes only and may be varied depending on the application to reduce and/or control warpage of the semiconductor device assembly 100 as would be appreciated by one of ordinary skill in the art having the benefit of this disclosure.

Figure 8:
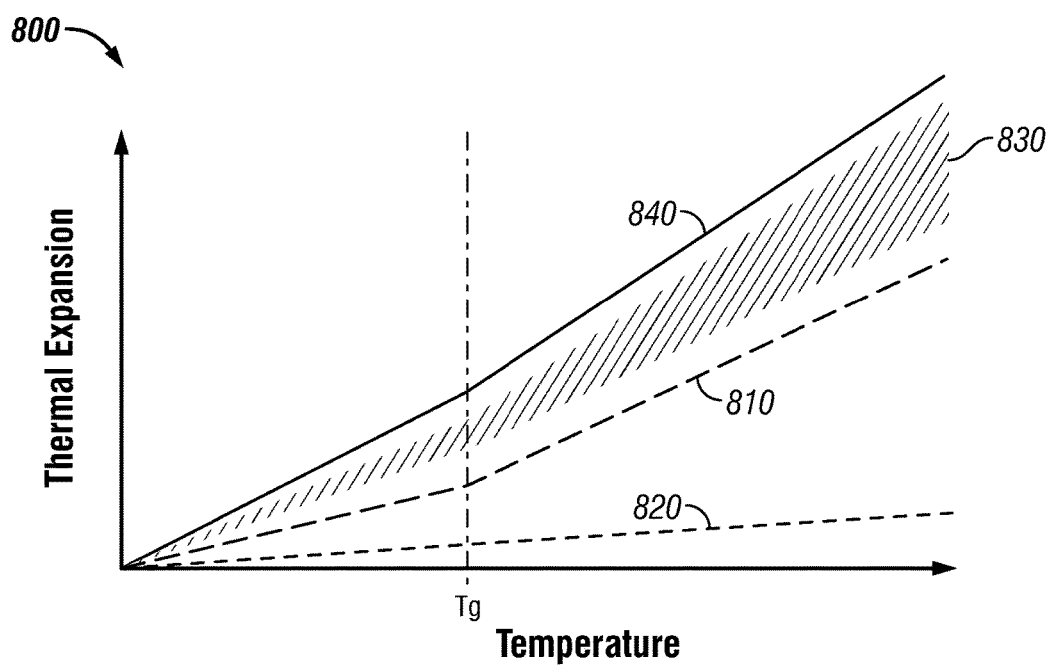
FIG. 8 is a graph showing the coefficient of thermal expansion (CTE) of various components of one embodiment of a semiconductor device as the temperature increases.

As shown in FIG. 8, the CTE of the mold compound 840 is typically larger than the CTE of the substrate 810 and typically is much larger than the CTE of the semiconductor device 820. As an example, the CTE of the mold compound may range between, but is not limited to, 10 to 15, the CTE of the substrate may range between, but is not limited to, 8 to 10, and the CTE of the semiconductor device may range between, but is not limited to, 2 to 3. As the individual components of a semiconductor device assembly each have a different CTE, the warpage of the semiconductor device assembly may exceed tolerable amounts as the semiconductor device assembly is subjected to elevated temperatures. A stiffener member may be chosen to reduce and/or control certain aspects of the warpage of the semiconductor device assembly. For example, a stiffener member may be tuned, or configured, to have a CTE 830 that falls between the CTE of the mold compound 840 and the CTE of the substrate 810. The addition of the stiffener member having a CTE 830 in this range may control the overall warpage of the semiconductor device assembly as would be appreciated by one of ordinary skill in the art having the benefit of this disclosure.

Figure 2:
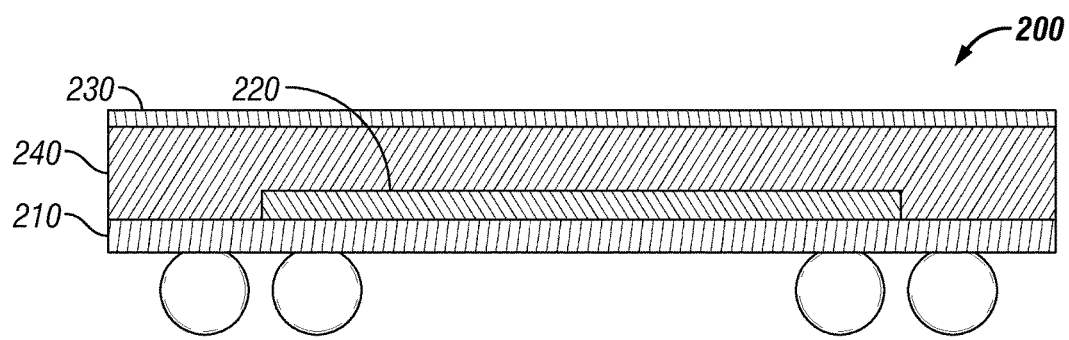
FIG. 2 is a schematic of one embodiment of a semiconductor device assembly having a stiffener member.

FIG. 2 is a schematic that shows one embodiment of the present disclosure of a semiconductor device assembly 200. The semiconductor device assembly 200 includes a semiconductor device 220 positioned on a first or top surface of a substrate 210. A mold compound 240 encapsulates the semiconductor device 220 and a stiffener member 230 is positioned on a portion of the mold compound 240. As discussed above, the CTE of the substrate 210, the semiconductor device 220, and the mold compound 240 may differ, which may lead to unwanted warpage of the semiconductor device assembly 200 as the semiconductor device assembly 200 is subjected to elevated temperatures.

The stiffener member 230 may be tuned, or configured, to reduce and/or control the warpage of the semiconductor device assembly 200. For example, the stiffener member 230 may have a CTE that differs from the individual CTEs of the substrate 210, the semiconductor device 220, and the mold compound 240. The stiffener member 230 may be configured with a specific CTE so that when located on the top surface of the mold compound 240 the warpage of the semiconductor device assembly 200 is reduced and/or controlled, in some aspect. For example, the addition of the stiffener member 230 may reduce the warpage of the semiconductor device assembly 200 to be 50 microns or less when subjected to a specified elevated temperature, which may be acceptable. Additionally, the stiffener member 230 may be added to control the shape of the warpage of the semiconductor device assembly 200 as discussed herein. The size, shape, and/or the location of the stiffener member 230 are shown for illustrative purposes only and may be varied depending on the application to reduce and/or control warpage of the semiconductor device assembly 200 as would be appreciated by one of ordinary skill in the art having the benefit of this disclosure.

Figure 3A:
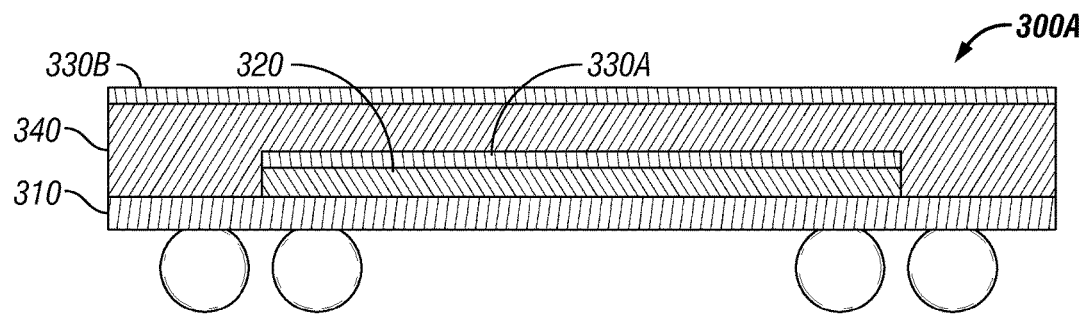
FIG. 3A is a schematic of one embodiment of a semiconductor device assembly having multiple stiffener members.

FIG. 3A is a schematic that shows one embodiment of the present disclosure of a semiconductor device assembly 300A. The semiconductor device assembly 300A includes a semiconductor device 320 positioned on a first or top surface of a substrate 310. A stiffener member 330A is positioned on a first or top surface of the semiconductor device 320 and a mold compound 340 encapsulates at least the stiffener member 330A and the semiconductor device 320. A second stiffener member 330B is positioned on a portion of the mold compound 340. The CTE of the substrate 310, the semiconductor device 320, and the mold compound 340 may differ, which may lead to unwanted warpage of the semiconductor device assembly 300A as the semiconductor device assembly 300A is subjected to elevated temperatures.

The stiffener members 330A, 330B may be tuned, or configured, to reduce and/or control the warpage of the semiconductor device assembly 300A. The stiffener members 330A, 330B may have CTEs that differ from the individual CTEs of the substrate 310, the semiconductor device 320, and the mold compound 340. The stiffener members 330A, 330B may each be configured with a specific CTE so that when located on the top surface of the semiconductor device 320 and on a portion of the mold compound 340 the warpage of the semiconductor device assembly 300A is reduced and/or controlled in some aspect. The individual CTEs of the stiffener members 330A, 330B may differ. The addition of the stiffener members 330A, 330B may reduce the warpage of the semiconductor device assembly 300A to be 50 microns or less when subjected to a specified elevated temperature, which may be acceptable. Additionally, the stiffener members 330A, 330B may be added to control the shape of the warpage of the semiconductor device assembly 300A as discussed herein. The size, shape, number, and/or the location of the stiffener members 330A, 330B are shown for illustrative purposes only and may be varied depending on the application to reduce and/or control warpage of the semiconductor device assembly 300A as would be appreciated by one of ordinary skill in the art having the benefit of this disclosure. For example, stiffener member 330A may be comprised of a plurality of stiffener members, stiffener member 330B may be comprised of a plurality of stiffener members, and/or both stiffener member 330A and stiffener member 330B may be each comprised of a plurality of stiffener members.

Figure 3B:
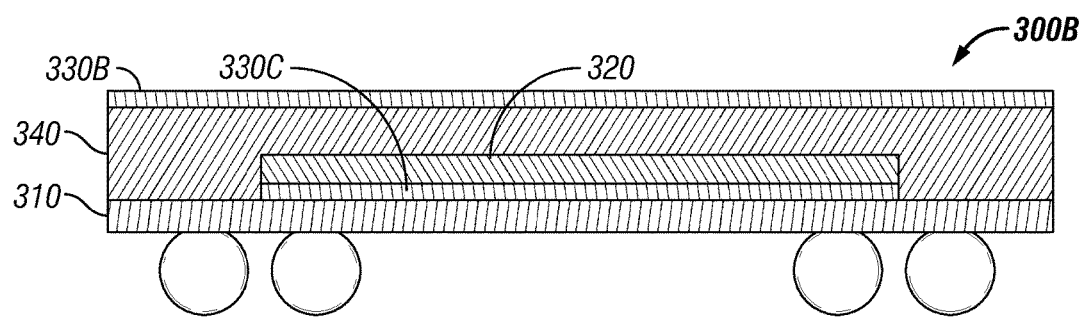
FIG. 3B is a schematic of one embodiment of a semiconductor device assembly having multiple stiffener members.

FIG. 3B is a schematic that shows one embodiment of the present disclosure of a semiconductor device assembly 300B. The semiconductor device assembly 300B includes a semiconductor device 320 positioned on a first or top surface of a substrate 310 with a stiffener member 330C positioned between at least a portion of the semiconductor device 320 and the substrate 310. A mold compound 340 encapsulates at least the stiffener member 330C and the semiconductor device 320. A second stiffener member 330B is positioned on a portion of the mold compound 340. The CTE of the substrate 310, the semiconductor device 320, and the mold compound 340 may differ, which may lead to unwanted warpage of the semiconductor device assembly 300B as the semiconductor device assembly 300B is subjected to elevated temperatures.

The stiffener members 330C, 330B may be tuned, or configured, to reduce and/or control the warpage of the semiconductor device assembly 300B. The stiffener members 330C, 330B may have CTEs that differ from the individual CTEs of the substrate 310, the semiconductor device 320, and the mold compound 340. The stiffener members 330C, 330B may each be configured with a specific CTE so that when located between at least a portion of the semiconductor device 320 and the substrate 310 and when located on a portion of the mold compound 340 the warpage of the semiconductor device assembly 300B is reduced and/or controlled in some aspect. The individual CTEs of the stiffener members 330C, 330B may differ. The addition of the stiffener members 330C, 330B may reduce the warpage of the semiconductor device assembly 300B to be 50 microns or less when subjected to a specified elevated temperature, which may be acceptable. Additionally, the stiffener members 330C, 330B may be added to control the shape of the warpage of the semiconductor device assembly 300B as discussed herein. The size, shape, number, and/or the location of the stiffener members 330C, 330B are shown for illustrative purposes only and may be varied depending on the application to reduce and/or control warpage of the semiconductor device assembly 300B as would be appreciated by one of ordinary skill in the art having the benefit of this disclosure. For example, stiffener member 330C may be comprised of a plurality of stiffener members, stiffener member 330B may be comprised of a plurality of stiffener members, and/or both stiffener member 330C and stiffener member 330B may be each comprised of a plurality of stiffener members.

Figure 4:
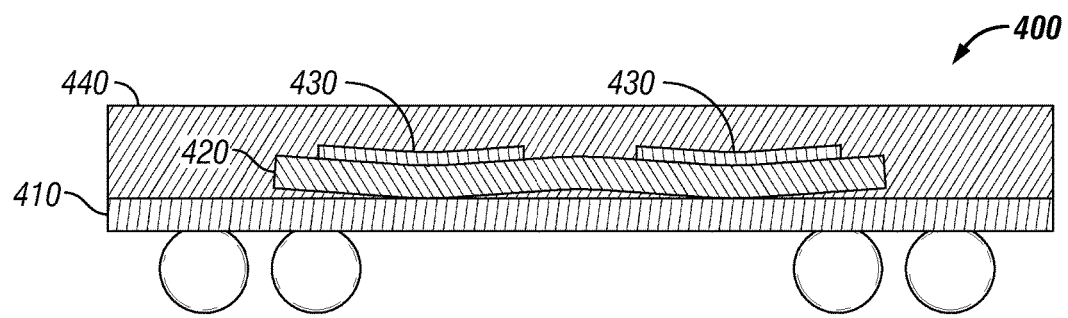
FIG. 4 is a schematic of one embodiment of a semiconductor device assembly having multiple stiffener members.

FIG. 4 is a schematic that shows one embodiment of the present disclosure of a semiconductor device assembly 400. The semiconductor device assembly 400 includes a semiconductor device 420 positioned on a first or top surface of a substrate 410. FIG. 4 shows the semiconductor device 420 having a warpage. Stiffener members 430 may be positioned on a first or top surface of the semiconductor device 420. A mold compound 440 encapsulates at least the stiffener members 430 and the semiconductor device 420. As discussed herein, the individual CTEs of the substrate 410, the semiconductor device 420, and the mold compound 440 may differ, which may lead to warpage of the semiconductor device assembly 400 as the semiconductor device assembly 400 is subjected to elevated temperatures. For example, the semiconductor device assembly 400 may be subjected to temperatures of at least 260 degrees Celsius during various processing operations.

The stiffener members 430 may be placed at locations along the semiconductor device 420 to control the warpage of the semiconductor device 420 and/or the warpage of the semiconductor device assembly 400. Further, the stiffener members 430 may be tuned, or configured, to reduce and/or control the warpage of the semiconductor device assembly 400 and/or the warpage of the semiconductor device 420. The stiffener members 430 may have individual CTEs that differ from the individual CTEs of the substrate 410, the semiconductor device 420, and the mold compound 440. The size, shape, and/or the location of the stiffener members 430 are shown for illustrative purposes only and may be varied depending on the application to reduce and/or control warpage of the semiconductor device assembly 400 as would be appreciated by one of ordinary skill in the art having the benefit of this disclosure. For example, the stiffener members 430 may be located on the substrate 410, the semiconductor device 420, and/or the mold compound 440.

Figure 5:
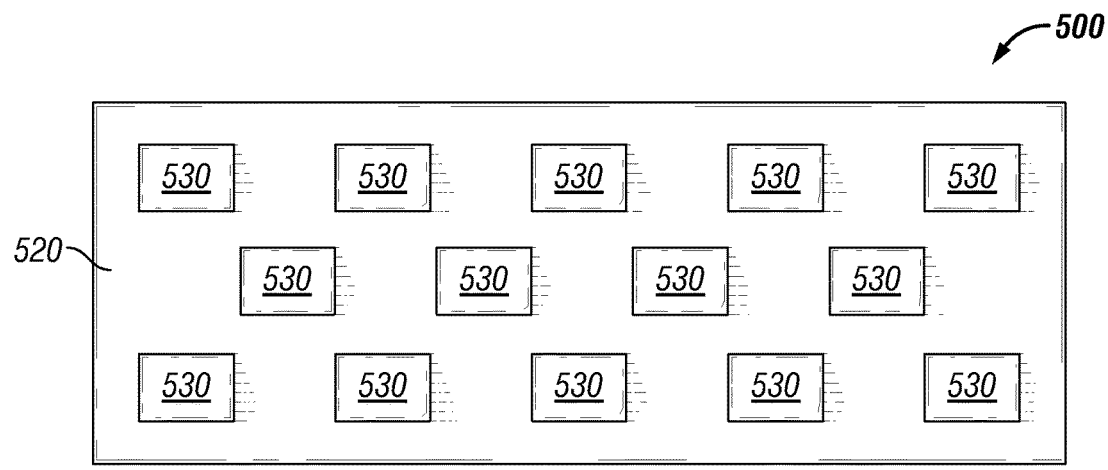
FIG. 5 is a top view schematic of one embodiment of multiple stiffener members arranged in a pattern on a semiconductor device.

FIG. 5 shows a top view schematic of an embodiment of a semiconductor device assembly 500. The semiconductor device assembly 500 includes multiple stiffener members 530 arranged in a pattern on a surface of a semiconductor device 520. The stiffener members 530 may be tuned, or configured, to reduce and/or control the warpage of the semiconductor device assembly 500. The stiffener members 530 may have CTEs that differ from the individual CTE of the semiconductor device 520. The stiffener members 530 are arranged in a specific pattern that is configured to control the warpage of the semiconductor assembly 500 at an elevated temperature.

The pattern of the stiffener members may reduce the warpage of the semiconductor device assembly 500 to be 50 microns or less or may control the shape of the warpage of the semiconductor device assembly 500 when subjected to a specified elevated temperature. The size, shape, pattern, and/or the location of the stiffener members 530 are shown for illustrative purposes only and may be varied depending on the application to reduce and/or control warpage of the semiconductor device assembly 500 as would be appreciated by one of ordinary skill in the art having the benefit of this disclosure. The semiconductor device 320 may be, but is not limited to, a semiconductor substrate, wafer, panel, or a single die from a wafer or substrate as would be appreciated by one of ordinary skill in the art having the benefit of this disclosure.

Figure 6A:
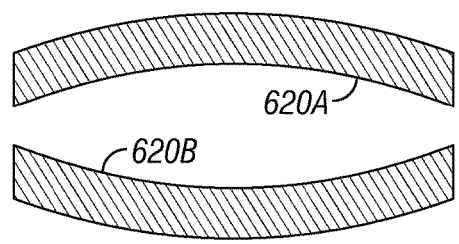
FIG. 6A is a schematic of two semiconductor devices having different warpages.

It may be desirable to connect a first semiconductor device to a second semiconductor device. For example, it may be desirable to connect a memory device to a top surface of a processor. FIG. 6A shows a schematic of a first semiconductor device 620A and a second semiconductor device 620B both at an elevated temperature. The first semiconductor device 620A may have a first warpage at the elevated temperature and the second semiconductor device 620B may have a second warpage at the elevated temperature.

If the first warpage and the second warpage differ, it may be difficult to connect the first semiconductor device to the second semiconductor device. For example, the first semiconductor device 620A may have a substantially convex warpage and the second semiconductor device 620B may have a substantially concave warpage with respect to the warpage of the first semiconductor device 620A. The warpages of the two semiconductor devices 620A, 620B are shown for illustrative purposes only and may differ as would be appreciated by one of ordinary skill in the art having the benefit of this disclosure.

It may be desirable to connect the first semiconductor device 620A to the second semiconductor device 620B, but having differing warpages may be problematic. For example, the two semiconductor devices 620A, 620B may not properly bond together due to the different warpages. Likewise, the different warpages of the two semiconductor devices 620A, 620B may lead to failed interconnects between the two devices 620A, 620B.

Figure 6B:
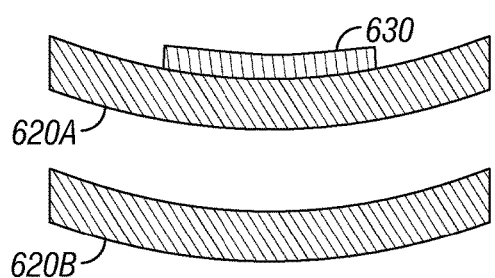
FIG. 6B is a schematic of the two semiconductor devices of FIG. 6A with a stiffener member added to one of the semiconductor devices.

FIG. 6B shows a schematic of the first semiconductor device 620A and the second semiconductor device 620B both at an elevated temperature with a stiffener member 630 added to a portion of the first semiconductor device 620A. The stiffener member 630 has been tuned, or configured, to change the shape of the warpage of the first semiconductor device 620A to substantially correspond to the warpage of the semiconductor device 620B, which may help to connect the two devices 620A, 620B together to form a semiconductor device assembly. The stiffener member 630 may be used to control the shape of warpage, rather than reduce the warpage, as would be appreciated by one of ordinary skill in the art having the benefit of this disclosure. For example, stiffener members 630 may be used to conform the warpage or shape of a semiconductor device to substantially correspond to the warpage or shape of another semiconductor device.

The "tunable" stiffener members may be comprised of various materials that permit the reduction and/or control of the warpage of a semiconductor device and/or semiconductor devices assembly at elevated temperatures as would be appreciated by one of ordinary skill in the art having the benefit of this disclosure. For example, the stiffener member may be, but is not limited to, metal, metal dielectric, carbon nanotubes, fiberglass, woven material, glass, and/or combinations thereof. The stiffener members may further be "tuned" by varying the shape, location, configuration, number, and/or density as would be appreciated by one of ordinary skill in the art having the benefit of this disclosure.

Figure 7:
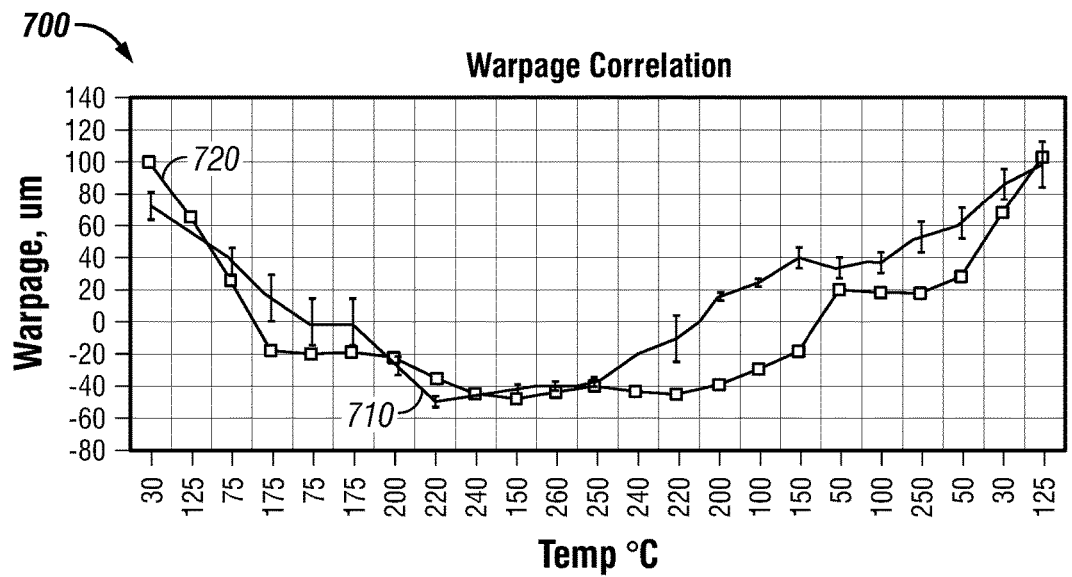
FIG. 7 is a graph showing warpage correlation between the actual warpage of a semiconductor device and the simulated warpage of the semiconductor device.

Various methods may be used to determine the warpage or potential warpage of a semiconductor device or a semiconductor device assembly as would be appreciated by one of ordinary skill in the art having the benefit of this disclosure. FIG. 7 shows a graph showing the warpage correlation between the actual warpage of a semiconductor device and a simulated warpage of the semiconductor device using thermal shadow moiré (TSM). Simulating a warpage of a semiconductor device or semiconductor device assembly can provide information concerning a potential stiffener member that can be added to reduce and/or control warpage. For example, the simulation may inform one of ordinary skill in the art the number and/or location of stiffeners needs to reduce warpage to an acceptable level or to control the shape of the warpage. Further, simulation information may inform one of ordinary skill in the art a range of CTE needed for a stiffener member(s) in order to adequately reduce and/or control warpage. TSM may be used by one of ordinary skill in the art to "tune" the stiffener member(s) needed to control the shape of warpage and/or reduce warpage to an acceptable level.

Figure 9:
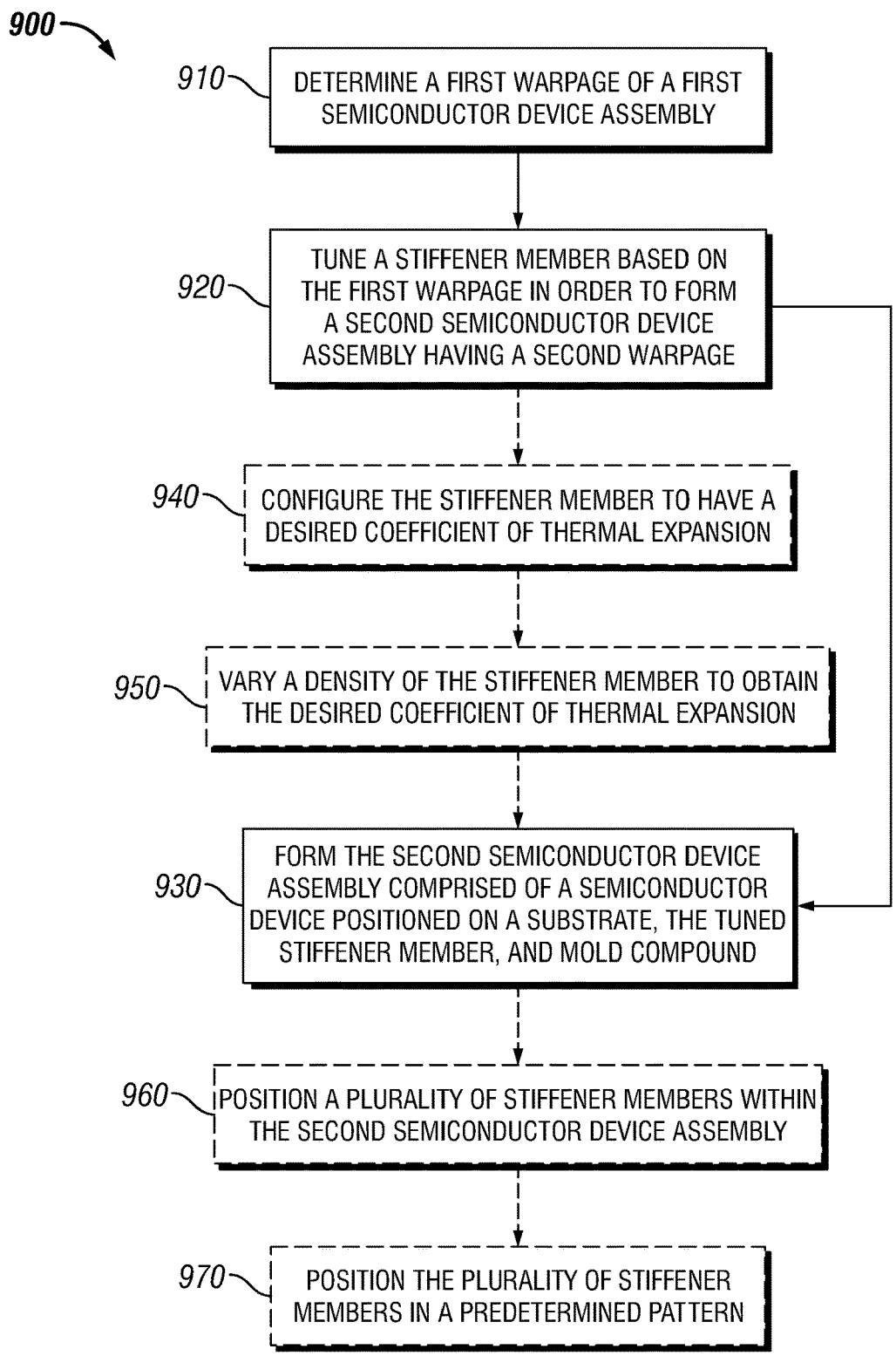
FIG. 9 is a flow chart of one embodiment of a method of forming a semiconductor device assembly.

FIG. 9 is a flow chart for a method 900 of forming a semiconductor device assembly. The method 900 includes the step 910 of determining a first warpage of a first semiconductor device assembly. As discussed above, various methods may be used to determine the warpage of a semiconductor device assembly. For example, TSM may be used to determine the warpage of a semiconductor device assembly. The method includes tuning a stiffener member based on the first warpage in order to form a second semiconductor device assembly having a second warpage, at step 920. The first warpage determined in step 910 may be unacceptable for various reasons. For example, the warpage may be too large, may place too much stress on the components of the semiconductor device assembly, or the warpage shape may not be acceptable depending on the application. At step 920, a stiffener member is tuned or configured so that when the stiffener member or stiffener members are added the semiconductor device assembly will have a second warpage, which is acceptable depending on the application. At step 930 of the method 900 is forming the second semiconductor assembly comprised of a semiconductor device position on a substrate, the tuned stiffener member, and mold compound.

The stiffener member may be added a separate element that is added to the elements that form a semiconductor device assembly. The stiffener member may be a layer of controlled stress or stack of layers of controlled stress within a component of the semiconductor device assembly. For example, the semiconductor device may be formed by depositing a layer of controlled stress within the semiconductor device based on warpage analysis of the semiconductor device and/or semiconductor device assembly without the layer or layers of controlled stress. As another example, the stiffener member may be a layer of material such as, but not limited to, metal, ceramic, glass, and/or a polymer added in situ during the formation of a component of the semiconductor device or semiconductor device assembly.

The method 900 may include configuring the stiffener member to have a desired CTE, at optional step 940. The method may also include obtaining the desired CTE by varying a density of the stiffener material, at optional step 950. At step 960, a plurality of stiffener members may be optionally positioned within the second semiconductor device assembly. The method 900 may include positioning the plurality of stiffener members in a predetermined pattern, at optional step 970.

Figure 10:
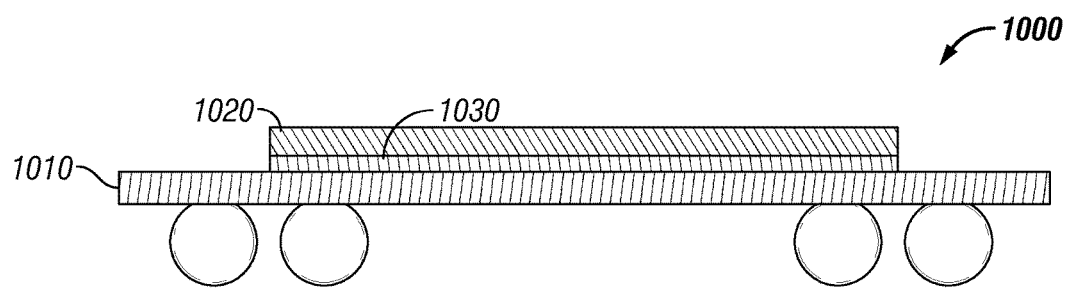
FIG. 10 is a schematic of one embodiment of a semiconductor device assembly having a stiffener member.

FIG. 10 is a schematic that shows one embodiment of the present disclosure of a semiconductor device assembly 1000. The semiconductor device assembly 1000 includes a semiconductor device 1020 positioned on a first or top surface of a substrate 1010 with a stiffener member 1030 positioned between at least a portion of the semiconductor device 1020 and the substrate 1010. The CTE of the substrate 1010 and the semiconductor device 1020 may differ, which may lead to unwanted warpage of the semiconductor device assembly 1000 as the semiconductor device assembly 1000 is subjected to elevated temperatures.

The stiffener member 1030 may be tuned, or configured, to reduce and/or control the warpage of the semiconductor device assembly 1000. The stiffener member 1030 may have a CTE that differs from the individual CTEs of the substrate 1010 and the semiconductor device 1020. The stiffener member 1030 may be configured with a specific CTE so that when located between at least a portion of the semiconductor device 1020 and the substrate 1010 the warpage of the semiconductor device assembly 1000 is reduced and/or controlled in some aspect. The addition of the stiffener member 1030 may reduce the warpage of the semiconductor device assembly 1000 to be 50 microns or less when subjected to a specified elevated temperature, which may be acceptable. Additionally, the stiffener member 1030 may be added to control the shape of the warpage of the semiconductor device assembly 1000 as discussed herein. The size, shape, number, and/or the location of the stiffener member 1030 is shown for illustrative purposes only and may be varied depending on the application to reduce and/or control warpage of the semiconductor device assembly 1000 as would be appreciated by one of ordinary skill in the art having the benefit of this disclosure. For example, stiffener member 1030 may be comprised of a plurality of stiffener members.

Figure 11:
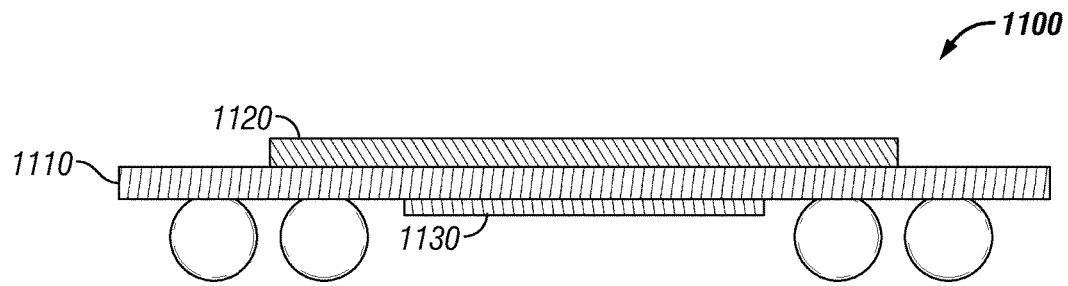
FIG. 11 is a schematic of one embodiment of a semiconductor device assembly having a stiffener member.

FIG. 11 is a schematic that shows one embodiment of the present disclosure of a semiconductor device assembly 1100. The semiconductor device assembly 1100 includes a semiconductor device 1120 positioned on a first or top surface of a substrate 1110 with a stiffener member 1130 positioned on a second or bottom surface of the substrate 1110. The CTE of the substrate 1110 and the semiconductor device 1120 may differ, which may lead to unwanted warpage of the semiconductor device assembly 1100 as the semiconductor device assembly 1100 is subjected to elevated temperatures.

The stiffener member 1130 may be tuned, or configured, to reduce and/or control the warpage of the semiconductor device assembly 1100. The stiffener member 1130 may have a CTE that differs from the individual CTEs of the substrate 1110 and the semiconductor device 1120. The stiffener member 1130 may be configured with a specific CTE so that when located between at least a portion of the semiconductor device 1120 and the substrate 1110 the warpage of the semiconductor device assembly 1100 is reduced and/or controlled in some aspect. The addition of the stiffener member 1130 may reduce the warpage of the semiconductor device assembly 1100 to be 50 microns or less when subjected to a specified elevated temperature, which may be acceptable. Additionally, the stiffener member 1130 may be added to control the shape of the warpage of the semiconductor device assembly 1100 as discussed herein. The size, shape, number, and/or the location of the stiffener member 1130 is shown for illustrative purposes only and may be varied depending on the application to reduce and/or control warpage of the semiconductor device assembly 1100 as would be appreciated by one of ordinary skill in the art having the benefit of this disclosure. For example, stiffener member 1130 may be comprised of a plurality of stiffener members.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A method of forming a semiconductor device assembly, the method comprising:
   determining a first warpage of a first semiconductor device assembly comprised of a semiconductor device, a substrate, and a mold compound;
   tuning a stiffener member based on the first warpage in order to form a second semiconductor device assembly having a second warpage, the second semiconductor device assembly comprised of the semiconductor device, the substrate, the mold compound, and the stiffener member;
   forming the second semiconductor device assembly comprised of the semiconductor device positioned on the substrate, the mold compound encapsulating at least the semiconductor device, and the stiffener member;
   wherein tuning the stiffener member further comprises configuring the stiffener member to have a desired coefficient of thermal expansion; and
   wherein tuning the stiffener member further comprises varying a density of the stiffener member to obtain the desired coefficient of thermal expansion.

2. The method of claim 1, wherein the second warpage substantially corresponds to a third warpage of a second semiconductor device or a third semiconductor device assembly.

3. The method of claim 1, wherein turning the stiffener member further comprises positioning a plurality of stiffener members within the second semiconductor device assembly to obtain the second warpage.

4. The method of claim 3, wherein positioning the plurality of stiffener members further comprises positioning the stiffener members in a predetermined pattern within the second semiconductor device assembly.

5. The method of claim 1, wherein the stiffener member is a layer of controlled stress within the substrate or the semiconductor device.

6. The method of claim 1, wherein tuning the stiffener member further comprises adding the stiffener member as a layer in situ in the substrate or the semiconductor device.

\* \* \* \* \*